United States Patent
Katsuki

(10) Patent No.: US 9,599,644 B2
(45) Date of Patent: Mar. 21, 2017

(54) SEMICONDUCTOR DEVICE

(71) Applicant: DENSO CORPORATION, Kariya, Aichi-pref. (JP)

(72) Inventor: Tomoya Katsuki, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/870,379

(22) Filed: Sep. 30, 2015

(65) Prior Publication Data
US 2016/0103159 A1 Apr. 14, 2016

(30) Foreign Application Priority Data
Oct. 8, 2014 (JP) ................. 2014-207167

(51) Int. Cl.
| | | |
|---|---|---|
| *G01R 19/165* | (2006.01) | |
| *H02J 1/00* | (2006.01) | |
| *G01R 19/00* | (2006.01) | |
| *G06F 1/28* | (2006.01) | |

(52) U.S. Cl.
CPC ... *G01R 19/16576* (2013.01); *G01R 19/0084* (2013.01); *G01R 19/16552* (2013.01); *G01R 19/16595* (2013.01); *G06F 1/28* (2013.01); *H02J 1/00* (2013.01)

(58) Field of Classification Search
CPC .......... G01R 19/0084; G01R 19/16576; G01R 27/2605; G01R 31/028
See application file for complete search history.

(56) References Cited

U.S. PATENT DOCUMENTS

| | | | | |
|---|---|---|---|---|
| 5,804,973 | A * | 9/1998 | Shinohara | B60L 11/1807 324/537 |
| 7,432,616 | B2 * | 10/2008 | Hatai | H02M 7/53871 307/66 |
| 9,007,087 | B2 * | 4/2015 | Avritch | G01R 31/028 324/764.01 |
| 9,097,747 | B2 * | 8/2015 | Ikeda | G01R 27/2605 |
| 9,188,633 | B2 * | 11/2015 | Shimizu | G01R 31/2839 |
| 2009/0020849 | A1 | 1/2009 | Smith et al. | |
| 2010/0072816 | A1 | 3/2010 | Kenkare et al. | |

(Continued)

FOREIGN PATENT DOCUMENTS

| | | |
|---|---|---|
| JP | H8-248086 A | 9/1996 |
| JP | H10-71926 A | 3/1998 |

(Continued)

*Primary Examiner* — Jeffrey Zweizig
(74) *Attorney, Agent, or Firm* — Posz Law Group, PLC

(57) ABSTRACT

A semiconductor device operates with electric power supplied from a direct-current power supply to an internal circuit in a state where a bypass capacitor is connected to a power supply terminal. The semiconductor device includes a load current control unit and a detection unit. The load current control unit changes an electric current supplied from the power supply terminal only in a predetermined operation period. The detection unit detects a voltage of the power supply terminal. The detection unit outputs a detection signal when the voltage is higher than a threshold upper limit in a case of being provided with the threshold upper limit. Alternatively, the detection unit outputs a detection signal when the voltage is lower than a threshold lower limit in a case of being provided with the threshold lower limit.

17 Claims, 5 Drawing Sheets

(56) References Cited

U.S. PATENT DOCUMENTS

2010/0315037 A1 12/2010 Aiura et al.
2012/0236630 A1 9/2012 Priel et al.
2013/0035819 A1* 2/2013 Wolft .................. G01R 31/007
　　　　　　　　　　　　　　　　　　　　　701/22

FOREIGN PATENT DOCUMENTS

JP　　　2007-240450 A　　9/2007
JP　　　2010-259178 A　　11/2010
JP　　　2011-174797 A　　9/2011

* cited by examiner

SEMICONDUCTOR DEVICE

CROSS REFERENCE TO RELATED APPLICATION

This application is based on Japanese Patent Application No. 2014-207167 filed on Oct. 8, 2014, the disclosure of which is incorporated herein by reference.

TECHNICAL FIELD

The present disclosure relates to a semiconductor device.

BACKGROUND

There is a technique of diagnosing a malfunction in a capacitor such as a bypass capacitor provided between power supply terminals of a semiconductor device. The technique of diagnosing a malfunction in a capacitor is, for example, described in JP 2010-259178 A and JP H10-71926 A.

Generally, there is a diagnosis method performed by using an external power supply and a POR (Power On Reset) circuit in a microcontroller in a semiconductor device. In such a method, first, an internal circuit of the microcontroller is stopped, and voltage of the external power supply is dropped for a moment. In a case where a bypass capacitor functions normally, since charges are accumulated in the bypass capacitor, even when the power supply voltage stops for a moment, the internal voltage of the microcontroller does not reduce below a lower limit voltage.

On the other hand, in a case where the bypass capacitor has an abnormality, since no charge is accumulated in the bypass capacitor, the internal voltage of the microcontroller will reduce below the lower limit voltage. When the internal voltage of the microcontroller reduces below the lower limit voltage, the POR circuit in the microcontroller operates and generates a reset signal to set the internal circuit to a reset state. In such a manner, the malfunction diagnosis of the bypass capacitor can be executed by the control of the external power supply and the POR circuit in the semiconductor device.

In the above-described technique, however, the malfunction diagnosis is executed on the basis of the presence or absence of the reset signal to the internal circuit. Thus, the malfunction diagnosis can be executed only in a state where the microcontroller is stopped.

In recent years, from the viewpoint of functional safety, it is required to detect a malfunction that exerts a critical influence on a system such as a power supply and a clock in a real-time manner. In the conventional technique in which the microcontroller needs to be stopped, it is difficult to detect a malfunction of the bypass capacitor in a real-time manner.

SUMMARY

It is an object of the present disclosure to provide a semiconductor device which can detect a malfunction of a bypass capacitor in a real-time manner without stopping an internal circuit.

According to an aspect of the present disclosure, a semiconductor device operates with electric power being supplied from a direct-current power supply to an internal circuit in a state where a bypass capacitor is connected to a power supply terminal. The semiconductor device includes a load current control unit and a detection unit. The load current control unit changes an electric current supplied from the power supply terminal only in a predetermined operation period. The detection unit detects a voltage of the power supply terminal. In a case where a threshold upper limit is set, the detection unit outputs a detection signal when the voltage is higher than the threshold upper limit. In a case where a threshold lower limit is set, the detection unit outputs a detection signal when the voltage is lower than the threshold lower limit.

In the configuration descried above, when the load current control unit changes the current supplied from the power supply terminal only in a predetermined operation period, the detection unit detects the voltage of the power supply terminal and outputs the detection signal when the voltage is higher than the threshold upper limit in the case where the threshold upper limit is provided or when the voltage is lower than the threshold lower limit in the case where the threshold lower limit is provided.

In a case where the bypass capacitor functions, even in the case where there is a voltage fluctuation caused by an increase or a decrease of a load current, the voltage fluctuation can be absorbed by charges accumulated in the capacitor. Therefore, the voltage of the power supply terminal does not exceeds the threshold upper limit or reduce below the threshold lower limit. On the other hand, in a case where the bypass capacitor has a malfunction, the voltage fluctuation, which is caused by the increase or the decrease of the load current, cannot be absorbed. In this case, the detection unit detects the state that the voltage of the power supply terminal exceeds the threshold upper limit or reduces below the threshold lower limit. As such, the presence or absence of a malfunction in the bypass capacitor can be diagnosed in a state where the internal circuit is in operation.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

First Embodiment

Figure 1:
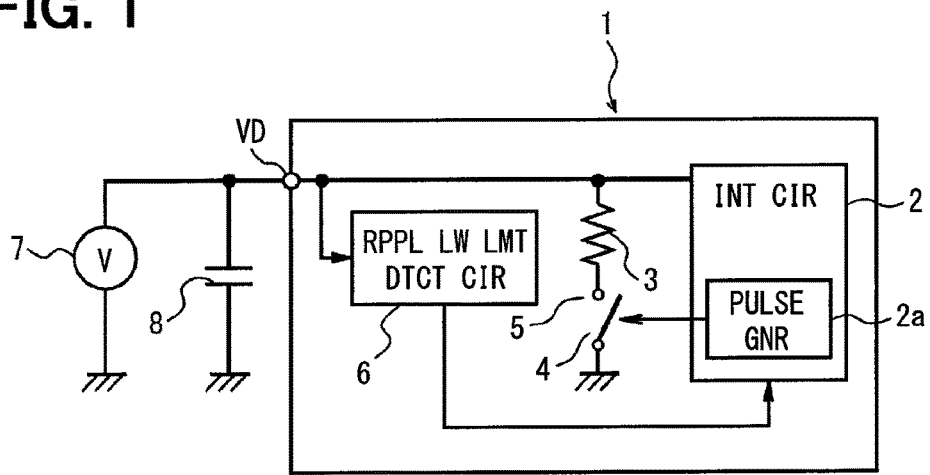
FIG. 1 is a diagram illustrating an electric configuration of a semiconductor device according to a first embodiment of the present disclosure.
Figure 2:
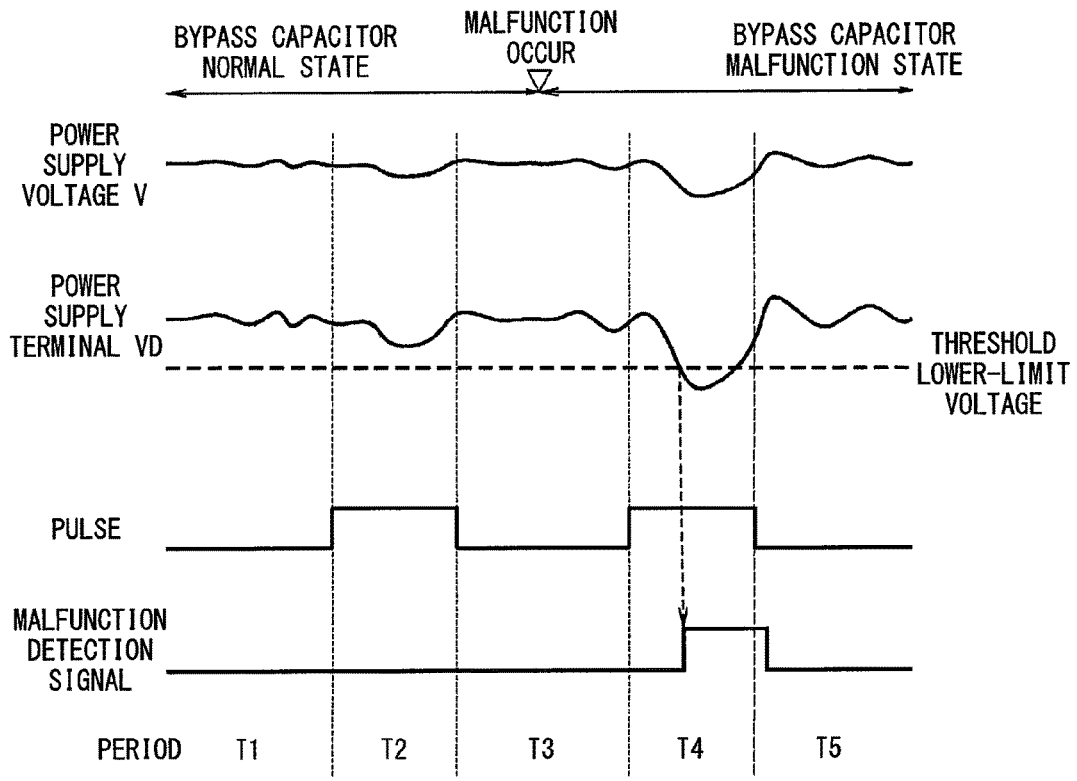
FIG. 2 is a time chart illustrating changes of potentials of respective parts associated with the semiconductor device.

A first embodiment of the present disclosure will be described hereinafter with reference to FIGS. 1 to 3. In FIG.

1 illustrating a circuit configuration, an IC chip 1 as a semiconductor device has therein a circuit, such as a microcontroller, as an internal circuit 2. The internal circuit 2 is constructed of an arithmetic processing device such as a CPU as the microcontroller, a storage device such as a memory, and peripheral devices having a timer function and a communication function.

In the present embodiment, the internal circuit 2 is provided with a pulse generator 2a. The internal circuit 2 is supplied with electric power from a power supply terminal VD of the IC chip 1. The power supply terminal VD is connected to the ground via a resistor 3 and a switch 4, which are connected in series. The resistor 3 corresponds to an impedance element, and the switch 4 corresponds to a switching element. The switch 4 is provided with an on/off control signal from the pulse generator 2a of the internal circuit 2. The resistor 3 and the switch 4 constitute a load current increasing circuit 5. As the switch 4, for example, a MOSFET or the like can be used. The load current increasing circuit 5 corresponds to a load current control unit.

For example, the pulse generator 2a employs the timer function of the internal circuit 2. The pulse generator 2a outputs a pulse signal which repeatedly switches the high level and the low level in a constant cycle. The cycle of the pulse signal and the duty ratio of the pulse signal being at a high level can be controlled by setting of the pulse generator 2a. The switch 4 is in an on state when the pulse signal is at the high level and connects the power supply terminal VD to the ground via the resistor 3 to allow an electric current. The switch 4 is in an off state when the pulse signal is at the low level and stops the electric current flowing to the ground via the resistor 3.

The IC chip 1 includes a ripple lower-limit-value detection circuit 6 for detecting the power supply voltage. The ripple lower-limit-value detection circuit 6 is connected to the power supply terminal VD. The ripple lower-limit-value detection circuit 6 functions as a detection unit. The ripple lower-limit-value detection circuit 6 stores a voltage level as a threshold defining a lower limit (hereinafter referred to as a threshold lower limit) therein. The ripple lower-limit-value detection circuit 6 outputs a detection signal S1 at the high level to the internal circuit 2 when the voltage of the power supply terminal VD detected reduces lower than the threshold lower limit. In this case, the voltage level as the threshold lower limit is set to a voltage level higher than a voltage level at which the power-on reset that disables the operation of the internal circuit 2 is operated.

A DC power supply 7 is connected to the power supply terminal VD from the outside of the IC chip 1. The DC power supply 7 supplies electric power to the internal circuit 2. A bypass capacitor 8 is connected between the power supply terminal VD and the ground. The bypass capacitor 8 has a function of stabilizing the supply voltage of the DC power supply 7 or removing high-frequency noise.

Next, the operation in the above-described configuration will be described with reference also to FIGS. 2 and 3. In the above-described configuration, the IC chip 1 is supplied with the electric power from the DC power supply 7 via the power supply terminal VD, and the electric power is supplied to the internal circuit 2 and the other not-illustrated circuits. In this state, even when the voltage of the DC power supply 7 fluctuates or the voltage fluctuates instantaneously for some reason, the bypass capacitor 8 absorbs the fluctuation so that a predetermined voltage that is equal to or higher than the threshold lower limit is supplied to the internal circuit 2.

However, in a state where the bypass capacitor 8 cannot function as a capacitor due to disconnection (break down), malfunction, or the like, when the voltage fluctuates as described above, the voltage supplied to the internal circuit 2 also fluctuates, and a situation results in an abnormality in operation may occur. When the voltage supplied to the internal circuit 2 reduces lower than a predetermined level, the power-on-reset function is activated and the internal operation of the internal circuit 2 is stopped. Further, the stopped state of the internal circuit 2 is kept until the power supply recovers and a voltage equal to or higher than the predetermined level is supplied to the internal circuit 2.

In the present embodiment, the operation stop of the internal circuit 2 due to an occurrence of the situation as described above during operation is suppressed as much as possible. The internal circuit 2 executes a diagnosis program according to the flowchart illustrated in FIG. 3 in advance at a proper timing and determines whether a malfunction in the bypass capacitor 8 occurs or not. As illustrated in the time chart of FIG. 2, for example, a normal operation is performed in the period T1, and the diagnosis program is executed in the period T2. After the period T3 in the normal operation state, the diagnosis program is executed again in the period T4. In the period T5 after the period T4, the normal operation is performed. It is assumed that the state of the bypass capacitor 8 is normal until the period T3, but a malfunction occurs in some midpoint of the period T3, so that the bypass capacitor 8 is in a state that it does not normally operate, such as in an open state.

Figure 3:
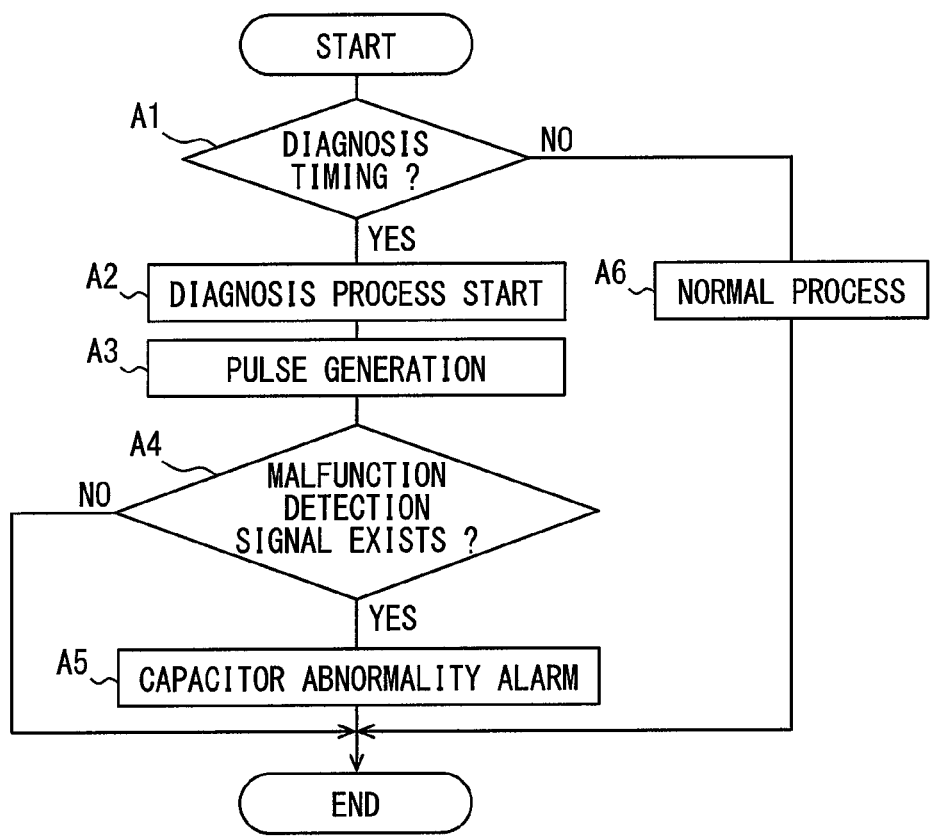
FIG. 3 is a flowchart of a diagnosis program performed by an internal circuit of the semiconductor device.

The internal circuit 2 starts the diagnosis program of FIG. 3 and, first, determines whether it is a diagnosis timing or not (A1). The internal circuit 2 determines a predetermined diagnosis timing which is preliminarily set by counting of a clock or the like. When it is the diagnosis timing, the internal circuit 2 determines as "YES", and starts a diagnosis process (A2). In the diagnosis process, the internal circuit 2 permits the pulse generator 2a to generate a pulse (A3). Consequently, a high-level signal is output from the pulse generator 2a to the switch 4, and the switch 4 shifts to the on state.

When the switch 4 shifts to the on state in the state where the power is supplied from the power supply terminal VD to the internal circuit 2, a load current temporarily increases via the resistor 3 and the switch 4. At this time, when it is in the normal state, the bypass capacitor 8 functions and, in accordance with the increase in the load current, compensates the decrease in the current supply capability by the charges accumulated in the bypass capacitor 8. Therefore, it is less likely that the voltage of the power supply terminal VD will largely drop.

Thereafter, when the DC power supply 7 shifts to the state of being able to supply the increased load current, the power supply voltage to the internal circuit 2 is assured, and the power supply state returns to a stable state. In this case, the ripple lower-limit-value detection circuit 6 does not detect a voltage below the threshold lower limit, and does not output a malfunction detection signal at the high level. Therefore, the internal circuit 2 determines as "NO" in A4 and finishes the program.

On the other hand, in the case where a malfunction such as an open state occurs in the bypass capacitor 8 in the period T3, when the load current temporarily increases, the voltage of the power supply terminal VD decreases. In this case, since the charges by the bypass capacitor 8 cannot be supplied, the voltage is applied to the internal circuit 2 in a state where the decrease in the voltage is not recovered. Thus, when the terminal voltage of the power supply terminal VD which is detected reduces below the threshold lower-limit voltage, the ripple lower-limit-value detection circuit 6 outputs the malfunction detection signal at the high level. The voltage level of the threshold lower limit is higher than the voltage level at which the internal circuit 2 is set to a reset state. Therefore, the internal circuit 2 does not shift to the reset state and is not in the operation-stopped state.

Since the internal circuit 2 receives the malfunction detection signal at the high level in A4, it is determined as "YES". Then, an alarm indicative of abnormality of the bypass capacitor 8 is output (A5), and the diagnosis program is finished. Accordingly, the user is notified of occurrence of a malfunction in the bypass capacitor 8 by notifying means such as sound or display, and the system can be shifted to a safe state.

In the configuration described above, the IC chip 1 is provided with the load current increasing circuit 5, and the internal circuit 2 executes the diagnosis program. Therefore, a malfunction state of the bypass capacitor 8 can be diagnosed while keeping the internal circuit 2 in the normal operation state and without shifting the internal circuit 2 to the stopped state such as the power-on-reset.

The diagnosis program has been described as a program executed by periodically performing an interruption process in a state where the internal circuit 2 performs the normal process. As another example, it may be configured to independently execute the diagnosis program. In such a case, the program may be repeatedly executed from A1 without finishing after the completion of a series of the flow of processes.

Second Embodiment

Figure 4:
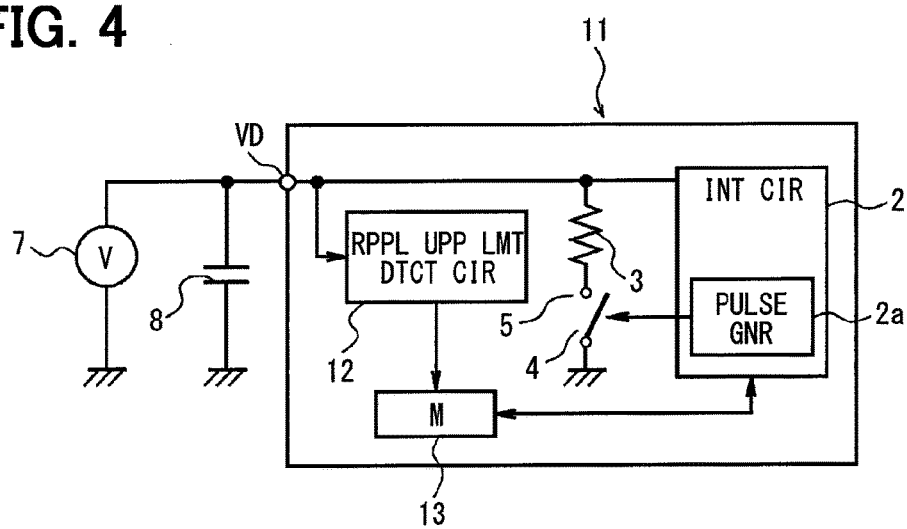
FIG. 4 is a diagram illustrating an electric configuration of a semiconductor device according to a second embodiment of the present disclosure.
Figure 5:
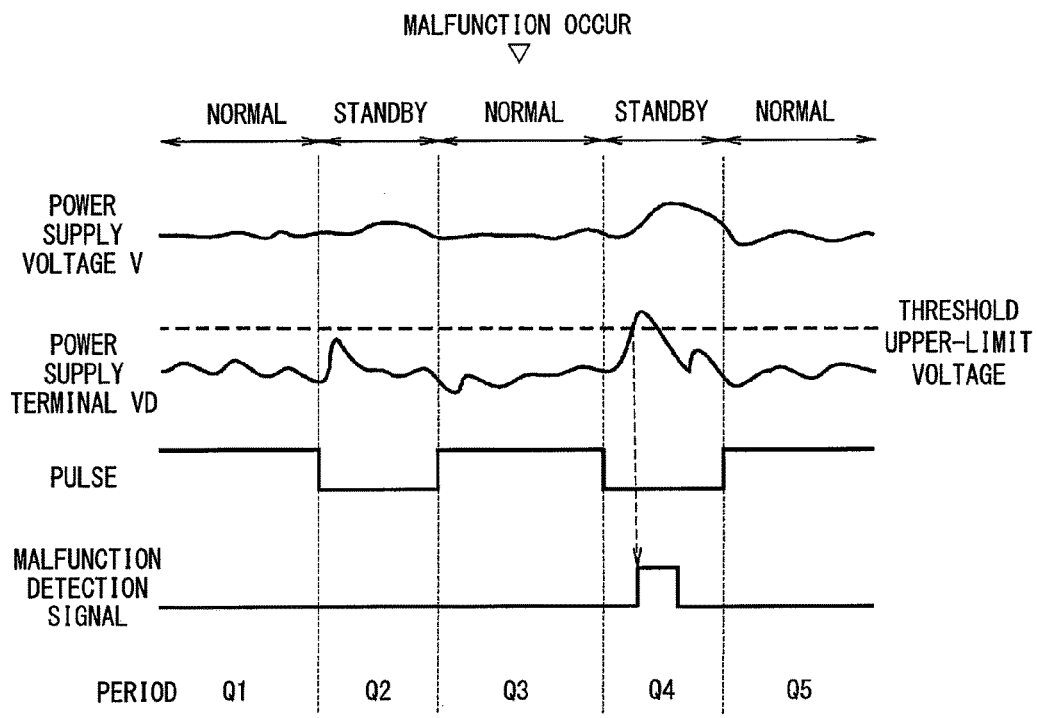
FIG. 5 is a time chart illustrating changes of potentials of respective parts associated with the semiconductor device.
Figure 6:
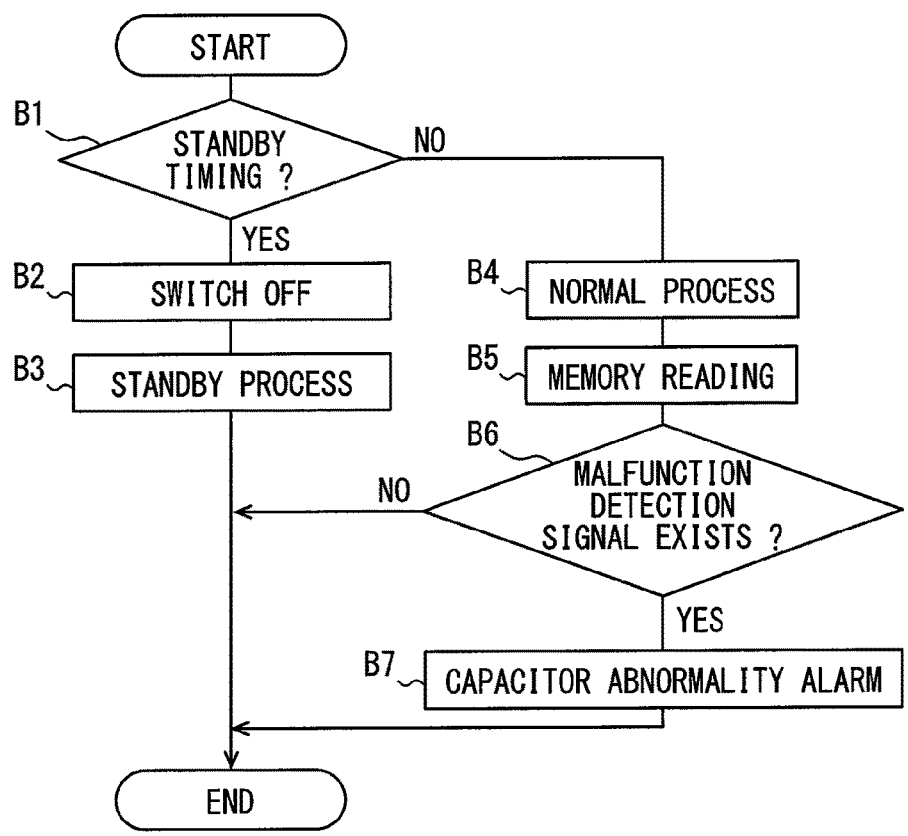
FIG. 6 is a flowchart of a diagnosis program performed by an internal circuit of the semiconductor device.

FIGS. 4 to 6 illustrate a second embodiment and, hereinafter, parts different from the first embodiment will be mainly described. In the second embodiment, an IC chip 11 of a type of detecting a malfunction in the bypass capacitor 8 by temporarily decreasing the load current is employed. The IC chip 11 can be used in the case where, for example, the drive capability of the DC power supply 7 is high and a voltage drop cannot be expected so much by the method of the first embodiment. Since the method of temporarily decreasing the load current is employed in the second embodiment, the diagnosis program is executed when the internal circuit 2 is in the standby state.

FIG. 4 illustrates the configuration of the IC chip 11. The IC chip 11 has a ripple upper-limit-value detection circuit 12 as the detection unit, in place of the ripple lower-limit-value detection circuit 6. The IC chip 11 also has a memory 13 storing a malfunction detection signal. The ripple upper-limit-value detection circuit 12 stores a voltage level as a threshold defining an upper limit (hereinafter referred to as a threshold upper limit) therein. The ripple upper-limit-value detection circuit 12 outputs a detection signal at the high level to the internal circuit 2 when the voltage of the power supply terminal VD detected is higher than the threshold upper limit. The voltage level which defines the threshold upper limit is set, for example, to a voltage level lower than an excessive voltage at which the operation of the internal circuit 2 becomes unstable. In the present embodiment, the load current increasing circuit 5 as the load current control unit operates so as to decrease the load current at the time of a diagnosis, so the load current increasing circuit 5 functions as a load current decreasing circuit.

In the present embodiment, the internal circuit 2 preliminarily executes a diagnosis program according to the flowchart illustrated in FIG. 6 at a proper timing, and determines, in the standby state, whether a malfunction in the bypass capacitor 8 occurs or not. As illustrated in the time chart of FIG. 5, for example, the normal operation is performed in the period Q1. In the period Q2, the state shifts to the standby state and the diagnosis process is executed. After the period Q3 of the normal state, the state shifts again to the standby state in the period Q4, and the diagnosis process is executed. Thereafter, the normal operation is executed in the period Q5. It is assumed that the state of the bypass capacitor 8 is normal until the period Q3 and, a malfunction occurs in some midpoint of the period Q3, and the bypass capacitor 8 is in a state that it does not normally operate, such an in an open state.

Next, the operation in the configuration described above will be described with reference to FIGS. 5 and 6. First, in the period Q1 as the normal period, the internal circuit 2 performs the normal operation and outputs a signal at the high level from the pulse generator 2a to increase the load current by the load current increasing circuit 5. In the state of the period Q1, slight fluctuations occur in the voltage of the DC power supply 7 and the voltage of the power supply terminal VD due to the operation of the internal circuit 2. As described above, however, since the drive capability of the DC power supply 7 is high and the bypass capacitor 8 normally operates, the ripple width as the width of the voltage fluctuation is small.

In the normal period Q1, the internal circuit 2 starts the diagnosis program of FIG. 6 and, first, determines whether it is a standby timing or not (B1). When it is determined as "YES" at B1, the internal circuit 2 permits the pulse generator 2a to output a low-level signal to turn off the switch 4 so as to shift to the standby state (B2). Thereafter, the internal circuit 2 performs the standby process and shifts to the standby state (B3). This state corresponds to the standby period Q2 in which the internal circuit 2 is in the standby state.

In the standby period Q2, since the switch 4 is shifted to the off state by the internal circuit 2, the load current decreases drastically. In accordance with the decrease in the load current, a rise in the voltage occurs in the DC power supply 7 and the power supply terminal VD. In the period Q2, however, the bypass capacitor 8 functions normally. Therefore, the voltage detected by the ripple upper-limit-value detection circuit 12 does not exceed the threshold upper limit, and the malfunction detection signal output is kept at the low level indicating a normal value.

In the case where the malfunction detection signal is the low-level signal in the standby state as described above, the malfunction detection signal of the high level is not stored in the memory 13. Therefore, in the case where the internal circuit 2 executes the diagnosis program thereafter and the timing is not the standby timing (NO in B1), the normal process is executed (B4). The internal circuit 2 reads the data in the memory 13 (B5). In the case where there is no malfunction detection signal of the high level, the internal circuit 2 determines as "NO" in B6, and finishes the program.

Next, the case where a malfunction due to disconnection occurs in the bypass capacitor 8 in some midpoint in the period Q3 in the normal state is assumed. In the state where the malfunction has occurred in the bypass capacitor 8, when the internal circuit 2 executes the diagnosis program and the timing becomes the standby timing (YES in B1), the internal circuit 2 permits the pulse generator 2a to output the low-level signal to turn off the switch 4 (B2). Thereafter, the internal circuit 2 performs the standby process and shifts to the standby state (B3).

In the IC chip 11, since the switch 4 is turned off, the load current decreases drastically. Due to the change, in a manner similar to the above, a rise of the voltage occurs in the DC power supply 7 and the power supply terminal VD. In this case, a voltage smoothing function by the bypass capacitor 8 does not operate. Therefore, a ripple voltage exceeds the threshold upper limit of the ripple upper-limit-value detection circuit 12, and a high-level signal indicating a malfunction state is output as the malfunction detection signal. The high-level signal indicating the malfunction state is stored as the malfunction detection signal in the memory 13.

Thereafter, when the internal circuit 2 executes the diagnosis program and the timing is not the standby timing (NO in B1), the normal process is executed (B4). The internal circuit 2 reads the data in the memory 13 (B5). Since there is the malfunction detection signal, the internal circuit 2 determines as "YES" in B6, displays an alarm indicating the abnormality in the bypass capacitor 8 (B7). Thus, the system can be shifted to the safe state.

In the configuration described above, the IC chip 11 is provided with the load current increasing circuit 5, and the internal circuit 2 executes the diagnosis program. The internal circuit 2 can diagnose the malfunction state of the bypass capacitor 8 by using the standby state.

In the foregoing embodiment, a drastically decreased state of the load current may be also provided by increasing the current just before detection, instead of controlling the switch 4 to be always in the on state at normal time.

Third Embodiment

Figure 7:
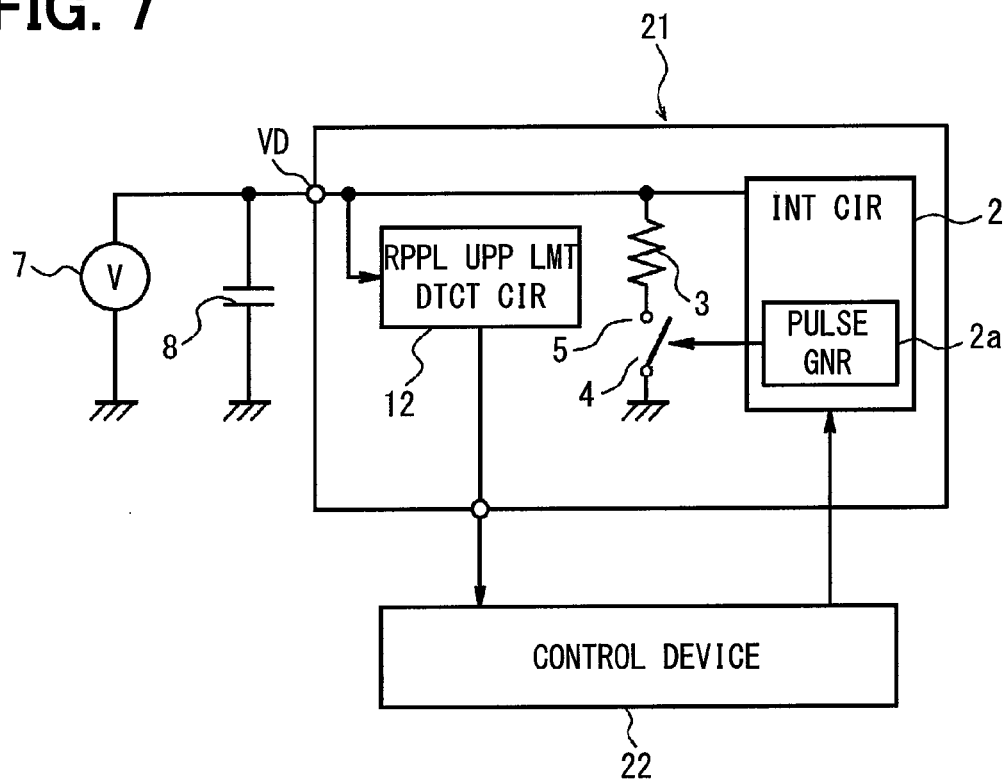
FIG. 7 is a diagram illustrating an electric configuration of a semiconductor device according to a third embodiment of the present disclosure.
Figure 8:
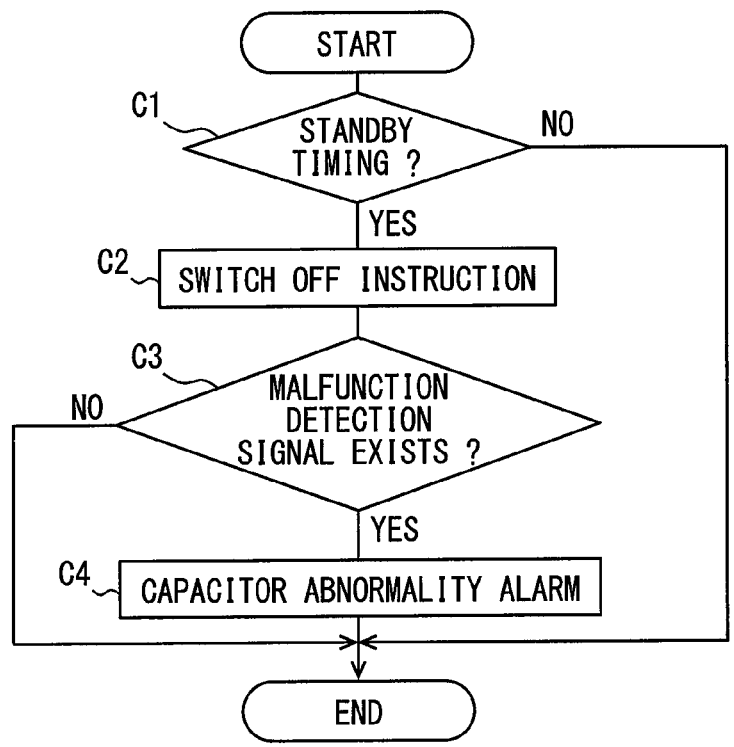
FIG. 8 is a flowchart of a diagnosis program performed by a control device according to the third embodiment.

FIGS. 7 and 8 illustrate a third embodiment and, hereinafter, parts different from the second embodiment will be mainly described. In the third embodiment, an IC chip 21 does not execute the diagnosis program. Instead, a malfunction state of the bypass capacitor 8 connected to the IC chip 21 is diagnosed by a control device 22 provided outside of the IC chip 21. In the third embodiment, in a manner similar to the second embodiment, the diagnosis process is executed in the standby state.

As illustrated in FIG. 7, although the IC chip 21 has the internal circuit 2, the internal circuit 2 does not execute the diagnosis program. Since an operation of drastically decreasing the load current is performed to detect a malfunction state of the bypass capacitor 8, the switch 4 is controlled to be on in the normal state and to be off in the standby state. The voltage of the power supply terminal VD which fluctuates according to a change in the load current at the time of standby is detected by the ripple upper-limit-value detection circuit 12.

The control device 22 performing the diagnosis process on the IC chip 21 is constructed by an IC chip or the like having a microcomputer and the like separately provided outside of the IC chip 21. The control device 22 is connected so as to receive the malfunction detection signal from the ripple upper-limit-value detection circuit 12 and is connected to the pulse generator 2a of the internal circuit 2 so as to perform the on/off control of the switch 4. The control device 22 stores a diagnosis program illustrated in FIG. 8 therein and executes the diagnosis process as will be described later.

Next, the operation in the configuration described above will be described also with reference to FIG. 8. In the normal period, the internal circuit 2 performs a normal process and permits the pulse generator 2a to output a high-level signal to increase the load current by the load current increasing circuit 5. In the normal state, slight fluctuations occur in the voltage of the DC power supply 7 and the voltage of the power supply terminal VD due to the operation of the internal circuit 2. However, as described above, since the drive capability of the DC power supply 7 is high and the bypass capacitor 8 normally operates, the ripple width as the width of the voltage fluctuation is small.

Next, the case where the diagnosis process is executed will be described. The control device 22 starts the diagnosis program of FIG. 8 and, first, determines whether it is a standby timing or not (C1). When the internal circuit 2 is at the standby timing (YES in C1), the internal circuit 2 is shifted to the standby state. In this case, the control device 22 transmits a control signal to the internal circuit 2 and permits the pulse generator 2a to output the signal at the low level to turn off the switch 4 (C2). In this state, the internal circuit 2 performs the standby process and shifts to the standby state, and the period becomes the standby period.

In the standby period Q2, in a manner similar to the second embodiment, the switch 4 is shifted to the off state by the internal circuit 2, so the load current decreases drastically. In accordance with the decrease in the load current, a rise in the voltage occurs in the DC power supply 7 and the power supply terminal VD. In the case where the bypass capacitor 8 functions normally, the voltage detected by the ripple upper-limit-value detection circuit 12 does not exceed the threshold upper limit, and the malfunction detection signal output is kept at a low-level indicating a normal value. Therefore, since the control device 22 does not receive the malfunction detection signal from the ripple upper-limit-value detection circuit 12, the control device 22 determines as "NO" in C3 and finishes the diagnosis process.

On the other hand, in the case where the bypass capacitor 8 has a malfunction, when the load current decreases drastically by turning off the switch 4 and a voltage rise occurs in the DC power supply 7 and the power supply terminal VD, the voltage smoothing function does not operate. As a result, the ripple voltage exceeds the threshold upper limit of the ripple upper-limit-value detection circuit 12 and a signal at the high level indicating a malfunction state is output. When the control device 22 receives the malfunction detection signal from the ripple upper-limit-value detection circuit 12, the control device 22 determines as "YES" in C3, displays an alarm indicating abnormality of the bypass capacitor 8 (C4). Thus, the system can be shifted to a safe state. The malfunction detection signal is transmitted from the control device 22 when the internal circuit 2 enters the normal state.

According to the configuration described above, although the internal circuit 2 does not execute the diagnosis program, the diagnosis program is executed by the control device 22 provided outside of the IC chip 22. Thus, a diagnosis of the malfunction state of the bypass capacitor 8 can be conducted by using the standby state of the internal circuit 2.

In the foregoing embodiment, a drastic decrease state of the load current may be also provided by increasing the current just before detection, instead of controlling the switch 4 to be always in the on state at normal time.

Other Embodiments

The present disclosure is not limited to only the foregoing embodiments but can be applied to various embodiments without departing from the gist and, for example, can be modified or expanded as follows.

The load current control unit is configured as the load current increasing circuit 5 including the switch 4 and the pulse generator 2a turning on and off the switch 4. As another example, the load current control unit may increase or decrease the load current in the internal circuit 2 by hastening or retarding an operation clock in the internal circuit 2, as a device of increasing or decreasing the load current As further another example of the device to increase or decrease the load current, the load current may be increased or decreased by increasing or decreasing the operation ratio of the internal circuit 2.

In the case of increasing or decreasing the load current at the time of a diagnosis by the load current control unit, the period in which the increase or decrease is performed (corresponding to the pulse width or the like) can be set to a period which is short to the degree that a malfunction of the bypass capacitor can be diagnosed. It can suppress excessive decrease or increase of the power supply voltage at the time of a diagnosis and restrict the operation of the internal circuit from being stopped or being unstable.

As the load current control unit, a current path of the load current increasing circuit 5 using the resistor 3 as a current passage path is set. In place of the resistor 3, an MOSFET in which the gate and the drain are short-circuited may be provided.

In the case where the switch 4 has a resistance component and has the function of an impedance element, the resistor 3 may be omitted.

As the switching element, except for the switch 4 using an MOSFET or the like, a bipolar transistor or a semiconductor element such as IGBT may be used.

The DC power supply 7 may be an external power supply itself or may be constructed as a power supply circuit which receives power supplied from the outside and supplies necessary power to the IC chip.

While only the selected exemplary embodiments and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiments and examples according to the present disclosure is provided for illustration only, and not for the purpose of limiting the disclosure as defined by the appended claims and their equivalents.

What is claimed is:

1. A semiconductor device which operates with electric power supplied from a direct-current power supply to an internal circuit in a state where a bypass capacitor is connected to a power supply terminal, the semiconductor device comprising:
   a load current control unit changing an electric current supplied from the power supply terminal only in a predetermined operation period;
   a detection unit detecting a voltage of the power supply terminal and outputting a detection signal when the voltage is lower than a threshold lower limit; and
   a storage circuit storing the detection signal output from the detection unit.

2. The semiconductor device according to claim 1, wherein
   the load current control unit increases a load current as the changing of the electric current.

3. The semiconductor device according to claim 2, wherein
   the load current control unit has a series circuit of a switch element and an impedance element provided to bypass the electric current to a power supply path from the power supply terminal to the internal circuit, and increases the load current by setting the switch element to an on state during the operation period.

4. The semiconductor device according to claim 1, wherein
   the threshold lower limit is set to a voltage level at which the internal circuit is operative.

5. A semiconductor device which operates with electric power supplied from a direct-current power supply to an internal circuit in a state where a bypass capacitor is connected to a power supply terminal, the semiconductor device comprising:
   a load current control unit changing an electric current supplied from the power supply terminal only in a predetermined operation period;
   a detection unit detecting a voltage of the power supply terminal and outputting a detection signal when the voltage is higher than a threshold upper limit; and
   a storage circuit storing the detection signal output from the detection unit.

6. The semiconductor device according to claim 5, wherein
   the load current control unit decreases a load current as the changing of the electric current.

7. The semiconductor device according to claim 6, wherein
   the load current control unit has a series circuit of a switch element and an impedance element provided to bypass the electric current to a power supply path from the power supply terminal to the internal circuit, and decreases the load current by setting the switch element to an off state during the operation period.

8. The semiconductor device according to claim 5, wherein
   the threshold upper limit is set to a voltage level at which the internal circuit is operative.

9. A semiconductor device which operates with electric power supplied from a direct-current power supply to an internal circuit in a state where a bypass capacitor is connected to a power supply terminal, the semiconductor device comprising:
   a load current control unit changing an electric current supplied from the power supply terminal only in a predetermined operation period;
   a detection unit detecting a voltage of the power supply terminal and outputting a detection signal when the voltage is lower than a threshold lower limit; and
   the internal circuit being operated by the electric power supplied from the direct-current power supply through the power supply terminal, wherein
   the threshold lower limit is set to a voltage level at which the internal circuit is operative,
   the threshold lower limit is higher than a voltage level at which an operation of the internal circuit is stopped to be reset, and
   the internal circuit determines that the bypass capacitor has a malfunction when receiving the detection signal from the detection unit.

10. The semiconductor device according to claim 9, wherein
    the load current control unit increases a load current as the changing of the electric current.

11. The semiconductor device according to claim 10, wherein
    the load current control unit has a series circuit of a switch element and an impedance element provided to bypass the electric current to a power supply path from the power supply terminal to the internal circuit, and increases the load current by setting the switch element to an on state during the operation period.

12. The semiconductor device according to claim 9, wherein
the internal circuit executes a diagnose program for diagnosing the bypass capacitor based on the detection signal at a predetermined timing during a normal operation of the internal circuit.

13. The semiconductor device according to claim 9, wherein
the detection unit outputs the detection signal when the voltage of the power supply terminal is lower than the threshold lower limit and higher than the voltage level at which the operation of the internal circuit is stopped to be reset, whereupon the internal circuit determines the malfunction of the bypass capacitor based on the detection signal without being stopped.

14. A semiconductor device which operates with electric power supplied from a direct-current power supply to an internal circuit in a state where a bypass capacitor is connected to a power supply terminal, the semiconductor device comprising:
a load current control unit changing an electric current supplied from the power supply terminal only in a predetermined operation period in which the internal circuit is in a standby state; and
a detection unit detecting a voltage of the power supply terminal and outputting a detection signal when the voltage is higher than a threshold upper limit in the operation period, wherein
the threshold upper limit is set to a voltage level at which the internal circuit is operative.

15. The semiconductor device according to claim 14, wherein
the load current control unit decreases a load current as the changing of the electric current.

16. The semiconductor device according to claim 15, wherein
the load current control unit has a series circuit of a switch element and an impedance element provided to bypass the electric current to a power supply path from the power supply terminal to the internal circuit, and decreases the load current by setting the switch element to an off state during the operation period.

17. The semiconductor device according to claim 14, further comprising a storage circuit storing the detection signal output from the detection unit.

* * * * *